United States Patent
Yamamoto et al.

(10) Patent No.: US 11,626,528 B2
(45) Date of Patent: Apr. 11, 2023

(54) PHOTOELECTRIC CONVERSION LAYER, SOLAR CELL, MULTI-JUNCTION SOLAR CELL, SOLAR CELL MODULE, AND PHOTOVOLTAIC POWER SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Kazushige Yamamoto, Yokohama Kanagawa (JP); Mutsuki Yamazaki, Yokohama Kanagawa (JP); Soichiro Shibasaki, Tokyo (JP); Yuya Honishi, Saitama Saitama (JP); Naoyuki Nakagawa, Tokyo (JP); Yoshiko Hiraoka, Kawasaki Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 0 days.

(21) Appl. No.: 17/186,049

(22) Filed: Feb. 26, 2021

(65) Prior Publication Data
US 2021/0184064 A1 Jun. 17, 2021

Related U.S. Application Data

(63) Continuation of application No. PCT/JP2020/010292, filed on Mar. 10, 2020.

(30) Foreign Application Priority Data

Jul. 26, 2019 (JP) .............................. JP2019-137981

(51) Int. Cl.
*H01L 25/00* (2006.01)
*H01L 31/00* (2006.01)
(Continued)

(52) U.S. Cl.
CPC ...... *H01L 31/0687* (2013.01); *H01L 31/0323* (2013.01)

(58) Field of Classification Search
CPC .................................................... H01L 31/0323
(Continued)

(56) References Cited

U.S. PATENT DOCUMENTS

2013/0104985 A1* 5/2013 Korevaar .............. H01L 31/075
136/260
2013/0298985 A1* 11/2013 Darvish .................. C30B 29/16
136/256
(Continued)

FOREIGN PATENT DOCUMENTS

JP 2005-239526 9/2005
JP 2006-124753 5/2006
(Continued)

OTHER PUBLICATIONS

Joshi, "New Cu(I)-Based p-Type Semiconducting Metal Oxides for Solar-to-Fuel Conversion: Investigation and Challenges", in book B. Viswanathan et al. (eds.), Materials and Processes for Solar Fuel Production, Nanostructure Science and Technology 174, DOI 10.1007/978-1-4939-1628-3_5 (Year: 2014).*

(Continued)

*Primary Examiner* — Angelo Trivisonno
(74) *Attorney, Agent, or Firm* — Amin, Turocy & Watson, LLP

(57) ABSTRACT

The photoelectric conversion layer of an embodiment is based on $Cu_2O$, contains at least one p-type dopant selected from the group consisting of Ge, Ta, and In, and has a band gap of equal to or more than 2.10 eV and equal to or less than 2.30 eV.

13 Claims, 4 Drawing Sheets

(51) Int. Cl.
*H02S 10/00* (2014.01)
*H01L 31/0687* (2012.01)
*H01L 31/032* (2006.01)

(58) Field of Classification Search
USPC .................................................. 136/243–265
See application file for complete search history.

(56) References Cited

U.S. PATENT DOCUMENTS

| | | | |
|---|---|---|---|
| 2013/0344645 | A1 | 12/2013 | Ahmari et al. |
| 2017/0218264 | A1* | 8/2017 | Klimov ................ C09K 11/883 |
| 2020/0006583 | A1 | 1/2020 | Shibasaki et al. |
| 2020/0194608 | A1 | 6/2020 | Yamamoto et al. |
| 2021/0013360 | A1 | 1/2021 | Shibasaki et al. |

FOREIGN PATENT DOCUMENTS

| | | |
|---|---|---|
| JP | 2006-124754 | 5/2006 |
| JP | 3828029 | 9/2006 |
| JP | 2012-186415 | 9/2012 |
| JP | 2015-520524 | 7/2015 |
| JP | 2017-054917 | 3/2017 |
| JP | 2017-098479 | 6/2017 |
| JP | 2018-046196 | 3/2018 |
| JP | 3221984 | 7/2019 |
| JP | 2020-145426 | 9/2020 |
| WO | 2019/146119 | 8/2019 |
| WO | 2020/059053 | 3/2020 |

OTHER PUBLICATIONS

Zoellner ("CuNb1-xTaxO3 (x ≤ 0.25) solid solutions: impact of Ta(V) substitution and Cu(I) deficiency on their structure, photocatalytic, and photoelectrochemical properties"), J. Mater. Chem. A, 2016, 4, 3115 (Year: 2016).*
Soon ("Early transition metal dopants in cuprous oxide: To spin or not to spin"), Current Applied Physics 13 (2013) 1707e1712 (Year: 2013).*
International Search Report and Written Opinion for International Application No. PCT/JP2020/010292 dated May 13, 2020, 11 pgs.
Minami, et al. "High-efficiency solar cells fabricated using oxide semiconductors", Applied Physics, vol. 86, No. 8 (2017).
Nishi "A Study of High-Efficiency Heterojunction Solar Cells Using a Cu2O Sheets as p-type Oxide semiconductor Layer", Kenjiro Takayanagi Foundation, Jan. 2017.
Minami, et al. "Cu2O-based solar cells using oxide semiconductors", Journal of Semiconductors, vol. 37, No. 1, 041002, 2016.
Minami, et al. "Efficiency enhancement using a Zn1-xGex-O thin film as an n-type window layer in Cu2O-based heterojunction solar cells", Applied Physics Express 9, 052301, 2016.
Kaur, et al. "Localized surface plasmon induced enhancement of electron-hole generation with silver metal island at vn-Al:ZnO/pCu2O heterojunction", Applied Physics Letters 107, 053901 (2015).
Lee, et al. "Atomic Layer Deposited Gallium Oxide Buffer Layer Enables 1.2 V Open-Circuit Voltage in Cuprous Oxide Solar Cells", Advanced Materials, 2014, 26, pp. 4704-4710.
Cai, et al. "The n-type conduction of indium-doped Cu2O thin films fabricated by direct current magnetron co-sputtering", Applied Physics Letters 107, 083901 (2015).
Ishizuka, et al. "Nitrogen Doping into Cu2O thin Films Deposited by Reactive Radio-Frequency Magnetron Supputering", Jpn. J. Applied Physics, vol. 40 (2001) pp. 2765-2768.
Shizuka, et al. "Control of the growth orientation and electrical properties of polycrystalline Cu2O thin films by group-IV elements doping", Applied Physics Letters, vol. 85, No. 21 (2004) pp. 4920-4922.
Shibasaki, et al. "Transparent Cu2O solar cell for high-efficiency and low-cost tandem photovoltaics", IEEE 46th Photovoltaic Specialists Conference (PVSC 46), 2019, pp. 1061-1063.
Nordseth, et al. "Optical Analysis of a ZnO /Cu2O Subcell in a Silicon-Based Tandem Heterojunction Solar Cell", Green and Sustainable Chemistry, 2017, 7, 57-69.
McShane, et al. "Junction studies on electrochemically fabricated p—n Cu2O homojunction solar cells for efficiency enhancement", Phys. Chem. Chem. Phys., 2012, 14, 6112-6118.
Lee, et al. "Nitrogen-doped cuprous oxide as a p-type hole-transporting layer in thin-film solar cells", I Mater Chem A, 2013, 1, 15416.
Ishizuka, et al. "Control of hole carrier density of polycrystalline Cu2O thin films by Si doping", Appl. Phys, Lett. 80, 950 (2002).

* cited by examiner

US 11,626,528 B2

PHOTOELECTRIC CONVERSION LAYER, SOLAR CELL, MULTI-JUNCTION SOLAR CELL, SOLAR CELL MODULE, AND PHOTOVOLTAIC POWER SYSTEM

CROSS-REFERENCE TO RELATED APPLICATIONS

This application is a Continuation application based upon and claims the benefit of priority from International Application PCT/JP2020/010292, the International Filing Date of which is Mar. 10, 2020, which claims priority to Japanese Patent Application No. JP2019-137981 filed on Jul. 26, 2019, the entire contents of both of which are incorporated herein by reference.

FIELD

Embodiments described herein relate generally to a photoelectric conversion layer, a solar cell, a multi-junction solar cell, a solar cell module, and a photovoltaic power system.

BACKGROUND

As a high-efficiency solar cell, a multi-junction (tandem) solar cell is known. A tandem solar cell can have higher efficiency compared with a uni-junction type because cells that are high in spectral sensitivity for each wavelength range can be used. As a top cell of a tandem solar cell, a cuprous oxide compound or the like that is a low-priced material but has a wide band gap is expected.

DETAILED DESCRIPTION

The photoelectric conversion layer of an embodiment is based on $Cu_2O$, contains at least one p-type dopant selected from the group consisting of Ge, Ta, and In, and has a band gap of equal to or more than 2.10 eV and equal to or less than 2.30 eV.

First Embodiment

Figure 1:
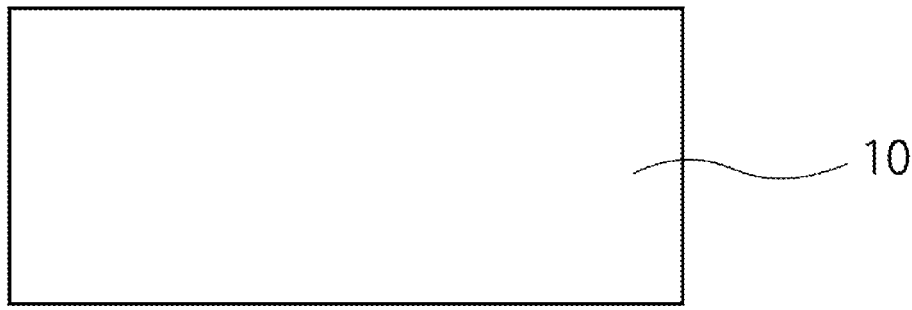
FIG. 1 is a sectional conceptual diagram of a photoelectric conversion layer of an embodiment.

The first embodiment relates to a photoelectric conversion layer 10. FIG. 1 is a conceptual diagram of the photoelectric conversion layer 10 of the first embodiment. The photoelectric conversion layer 10 is, for example, a semiconductor layer provided on a substrate on which a transparent electrode is formed. The photoelectric conversion layer 10 is a semiconductor layer that is a p-type, and mainly composed of cuprous oxide ($Cu_2O$) (90 wt % or more of the photoelectric conversion layer 10 is composed of $Cu_2O$).

The photoelectric conversion layer 10 contains a p-type dopant. While Si and N have been known as a p-type dopant in the $Cu_2O$ layer heretofore, the present inventors newly found an element functioning as a p-type dopant in the $Cu_2O$ layer by researches. As a p-type dopant of the photoelectric conversion layer 10 in the embodiment, at least one element selected from the group consisting of Ge, Ta, and In is preferred. The p-type dopant increases the hole concentration of the photoelectric conversion layer 10 and further improves the characteristics as a photoelectric conversion layer of the solar cell by addition of a small amount of the p-type dopant. As the p-type dopant contained in the photoelectric conversion layer 10 of the embodiment, Ge and/or Ta is more preferred, and Ge is further preferred.

A non-doped $Cu_2O$ layer has a band gap of equal to or more than 2.10 eV and equal to or less than 2.30 eV depending on the quality of the crystal. Since $Cu_2O$ has a very high band gap compared with the band gap of Si, $Cu_2O$ transmits almost all of the wavelengths of the absorption band of Si. Therefore, even when a solar cell using a $Cu_2O$ layer (photoelectric conversion layer based on $Cu_2O$ layer) and a solar cell using Si are laminated, the performance essential to the solar cell using Si can be substantially exerted. Therefore, it is desired to improve the photoelectric conversion layer 10 based on $Cu_2O$ with which power generation with higher efficiency can be aimed without narrowing the band gap of $Cu_2O$.

The photoelectric conversion layer 10 of the embodiment contains a very small amount of a p-type dopant. While the very small amount of the dopant increases the hole concentration to make the $Cu_2O$ layer more p-typed, specifically, from p-type to p type, the band gap of the $Cu_2O$ layer does not substantially change because of addition of the very small amount. When the p-type dopant is added in such an amount that causes change in the band gap, the photoelectric conversion layer 10 is in such a state that there are too many holes, and carrier electrons generated by photoelectric conversion are very easy to recombine with the holes. Therefore, it is impossible to dope the $Cu_2O$ layer with a p-type dopant in such an amount that causes change in the band gap from the viewpoint of obtaining a high-efficiency solar cell. Also, addition of a dopant including a p-type dopant to such an extent that makes the band gap be less than 2.10 eV is not preferred from the viewpoint of a combination with a solar cell using Si because the band gap is narrowed. Doping $Cu_2O$ with a large amount of a dopant that is not a p-type dopant for the purpose of changing the band cap is sometimes conducted for the purpose irrelevant to the present disclosure when there is no view of making a multi-junction type in the technique that fails to make the $Cu_2O$ layer transparent (multi-junction type cannot be made because of the non-transmissivity). However, in a multi-junction solar cell in which a solar cell using the transparent photoelectric conversion layer 10 and a solar cell having a narrow band gap are combined, there is no merit of doping for narrowing the band gap of the $Cu_2O$ layer.

The concentration of the p-type dopant preferably equal to or more than $1\times10^{15}$ atoms/$cm^3$ and equal to or less than $1\times10^{20}$ atoms/$cm^3$ entirely in the photoelectric conversion layer 10. That is, it is preferred that the lowest value of the concentration of the p-type dopant in the photoelectric conversion layer 10 is equal to or more than $1\times10^{15}$ atoms/$cm^3$, and the highest value is equal to or less than $1\times10^{20}$ atoms/cm$^3$. The photoelectric conversion layer 10 having the concentration of the p-type dopant sometimes contains an n-type dopant in an amount of about $1 \times 10^{14}$ atoms/cm$^3$ or less. When the photoelectric conversion layer 10 contains an n-type dopant, the concentration of the p-type dopant is dealt with as a value obtained by subtracting the concentration of the n-type dopant from the actual concentration of the p-type dopant. Presence of the p-type dopant exists only in part of the photoelectric conversion layer 10, and containment of a part not satisfying the aforementioned range are not preferred because characteristics vary in the photoelectric conversion layer 10. Too low concentration of the p-type dopant is not preferred because substantially no effect by the p-type dopant is provided. Therefore, it is preferred that the p-type dopant is omnipresent in the entire photoelectric conversion layer 10, and the concentration of the p-type dopant is equal to or more than $1 \times 10^{15}$ atoms/cm$^3$ and equal to or less than $1 \times 10^{20}$ atoms/cm$^3$ entirely in the photoelectric conversion layer 10.

Also, if the concentration of the p-type dopant is too high, the photoelectric conversion layer 10 becomes p+ type, and the band gap tends to narrow, and hence it is preferred that the concentration of the p-type dopant falls within the above preferred range. A more preferred range of the concentration of the p-type dopant in the photoelectric conversion layer 10 is equal to or more than $1 \times 10^{15}$ atoms/cm$^3$ and equal to or less than $1 \times 10^{18}$ atoms/cm$^3$.

It is preferred to make more transparent than the non-doped Cu$_2$O layer by containing the p-type dopant in low concentration entirely in the photoelectric conversion layer 10.

Doping with high concentration is not preferred because doping the Cu$_2$O layer with high concentration (for example, equal to or more than $1 \times 10^{22}$ atoms/cm$^3$) of metal other than Cu including the p-type dopant makes the Cu$_2$O layer be no longer the Cu$_2$O layer.

The fact that the concentration of the p-type dopant is equal to or more than $1 \times 10^{15}$ atoms/cm$^3$ and equal to or less than $1 \times 10^{20}$ atoms/cm$^3$ entirely in the photoelectric conversion layer 10 is determined by the following method. As shown in the perspective conceptual diagram of the photoelectric conversion layer 10 in FIG. 2, composition of the photoelectric conversion layer 10 is determined for nine analysis spots A1 to A9, to measure a p-type dopant concentration. Analysis is made for the nine analysis spots at three depths: a depth of 100 nm from the front side of the photoelectric conversion layer 10; a depth of a half (D/2) of the thickness (D) of the photoelectric conversion layer 10; and a depth of 100 nm from the back side of the photoelectric conversion layer 10. Each analysis spot is a square or a circle of about 5 mm$^2$ in size, and the center of each analysis step is analyzed. When all of the concentrations of the p-type dopant obtained in the spots are equal to or more than $1 \times 10^{15}$ atoms/cm$^3$ and equal to or less than $1 \times 10^{20}$ atoms/cm$^3$, the concentration of the p-type dopant is equal to or more than $1 \times 10^{15}$ atoms/cm$^3$ and equal to or less than $1 \times 10^{20}$ atoms/cm$^3$ (the lowest value of the concentration of the p-type dopant in the photoelectric conversion layer 10 is equal to or more than $1 \times 10^{15}$ atoms/cm$^3$, and the highest value of the concentration of the p-type dopant in the photoelectric conversion layer 10 is equal to or less than $1 \times 10^{20}$ atoms/cm$^3$) entirely in the photoelectric conversion layer 10. As the analysis method, secondary ion mass spectrometry (SIMS) and the like can be recited.

Figure 2:
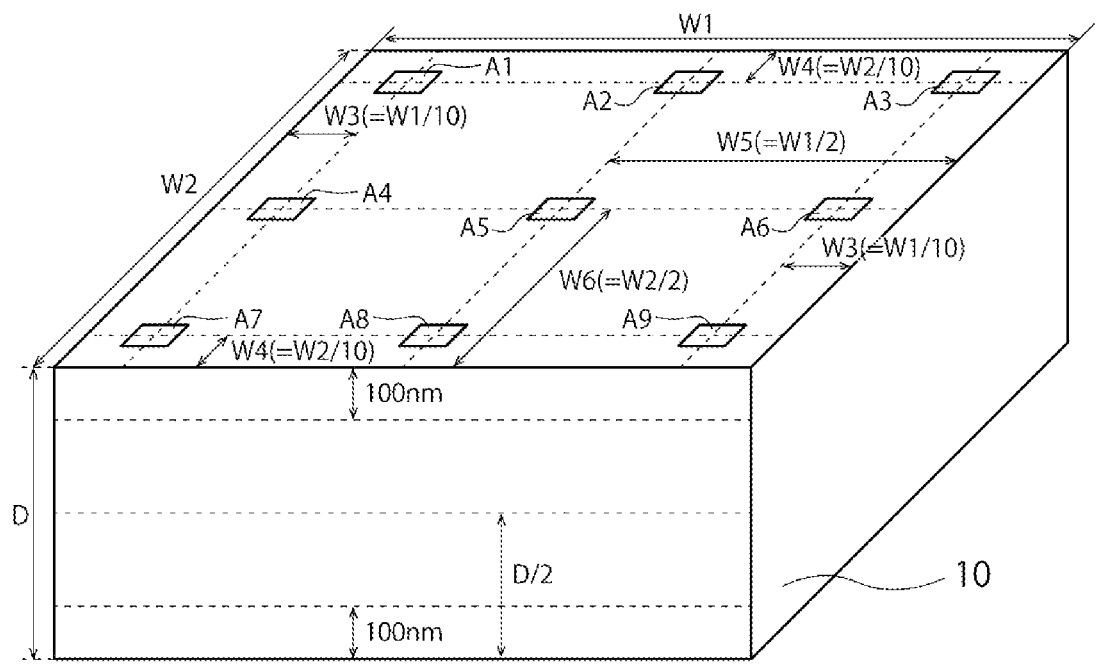
FIG. 2 is a perspective conceptual diagram of a photoelectric conversion layer of an embodiment.

The nine analysis spots are defined as follows. Letting the width and the length of the plane (principal plane) viewed from the front face or back face of the photoelectric conversion layer 10 be W1 and W2 (W1≤W2), respectively, a virtual line is drawn at a distance of W3 (=W1/10) inwardly from each of two sides facing in the widthwise direction of the photoelectric conversion layer 10, a virtual line is drawn at a distance of W4 (=D2/10) inwardly from each of two sides facing in the lengthwise direction of the solar cell 100, further, a virtual line parallel with the widthwise direction passing the center of the solar cell 100 (a virtual line at a distance of W5 (=W1/2) inwardly from sides facing in the widthwise direction of the photoelectric conversion layer 10) is drawn, a virtual line parallel with the longitudinal direction passing the center of the photoelectric conversion layer 10 (virtual line at a distance of W6 (=W2/2) inwardly from sides facing in the lengthwise direction of the photoelectric conversion layer 10) is drawn, and regions centered at the nine intersections of the virtual lines are defined as analysis spots A1 to A9. When the photoelectric conversion layer 10 is not rectangular, the analysis positions are defined as shown in FIG. 2 based on the rectangle inscribed in the photoelectric conversion layer 10.

It is preferred that a mean value (mean value of all of the p-type dopant concentrations) of the concentrations of the p-type dopant at nine analysis spots at three depths: the depth of 100 nm from the front side of the photoelectric conversion layer 10; the depth of a half (D/2) of the thickness (D) of the photoelectric conversion layer 10; and the depth of 100 nm from the back side of the photoelectric conversion layer 10 is equal to or more than $1 \times 10^{15}$ atoms/cm$^3$ and equal to or less than $1 \times 10^{19}$ atoms/cm$^3$. When the mean value is less than $1 \times 10^{15}$ atoms/cm$^3$, the hole concentration is entirely too low so that the characteristics of the photoelectric conversion layer 10 are approximate to those of the non-doped Cu$_2$O layer. When the mean value is more than $1 \times 10^{19}$ atoms/cm$^3$, recombination is likely to occur. Therefore, it is more preferred that the mean value of the entire p-type dopant concentration is equal to or more than $1 \times 10^{15}$ atoms/cm$^3$ and equal to or less than $1 \times 10^{19}$ atoms/cm$^3$.

The highest value of the concentration of the p-type dopant in the photoelectric conversion layer 10 (the highest value of the p-type dopant concentrations obtained by analyzing the analysis spots) is preferably equal to or more than 1 time and equal to or less than 10000 times, more preferably equal to or more than 1 time and equal to or less than 100 times, the lower value of the concentration of the p-type dopant in the photoelectric conversion layer 10 (the lowest value of the p-type dopant concentrations obtained by analyzing the analysis spots). Thus, the small variation in the concentration of the p-type dopant reduces the unevenness in the energy potential due to the variation in concentration of the dopant concentration in the film thickness direction in the conduction band and the valence band of the photoelectric conversion layer 10, so that electrons of photo carriers diffuse toward an n-type layer 2 without residing in the unevenness of the energy potential, and holes among photo carriers diffuse toward a first electrode 1 without residing in the unevenness of the energy potential. Therefore, an advantage of less carrier recombination is provided.

Also, the mean value of the p-type dopant concentrations at the depth of 100 nm from the front side of the photoelectric conversion layer 10 (mean value of front-side p-type dopant concentration: α (alfa) is preferably equal to or more than 1 time and equal to or less than 100 times the mean value of the p-type dopant concentrations at the depth of a half of the thickness of the photoelectric conversion layer 10 (mean value of central p-type dopant concentration: β (beta)) (β≤α≤1000β), and the mean value of the p-type dopant concentrations at the depth of 100 nm from the back side of the photoelectric conversion layer 10 (mean value of back-side p-type dopant concentration: γ (gamma)) is preferably equal to or more than 10 times and equal to or less than 1000 times the mean value of the p-type dopant concentrations at the depth of a half of the thickness of the photoelectric conversion layer 10 (mean value of central p-type dopant concentration: β) (10β≤γ≤1000β). The mean value of back-side p-type dopant concentration is preferably equal to or more than 10 times and equal to or less than 1000 times the mean value of front-side p-type dopant concentration. The small variation in the concentration of the p-type dopant in the thickness direction of the photoelectric conversion layer 10 reduces the unevenness in the energy potential due to the variation in concentration of the dopant concentration in the conduction band and the valence band of the photoelectric conversion layer 10, so that electrons of photo carries diffuse toward the n-type layer 2 without residing in the unevenness of the energy potential, and holes among photo carries diffuse toward the first electrode 1 without residing in the unevenness of the energy potential. Therefore, an advantage of less carrier recombination is provided.

Therefore, it is preferred that the mean value (α) of the p-type dopant concentrations at the depth of 100 nm from the front side of the photoelectric conversion layer 10 is equal to or more than 1 time and equal to or less than 50 times the mean value (β) of the p-type dopant concentrations at the depth of a half of the thickness of the photoelectric conversion layer 10 (β≤α≤50β), and it is more preferred that the mean value (γ) of the p-type dopant concentrations at the depth of 100 nm from the back side of the photoelectric conversion layer 10 is equal to or more than 10 times and equal to or less than 500 times the mean value (β) of the p-type dopant concentrations at the depth of a half of the thickness of the photoelectric conversion layer 10 (10β≤γ≤500β). It is preferred that the mean value (β) of the p-type dopant concentrations at the depth of a half of the thickness of the photoelectric conversion layer 10 is specifically equal to or more than $1\times10^{15}$ atoms/cm$^3$ and equal to or less than $1\times10^{16}$ atoms/cm$^3$.

The photoelectric conversion layer 10 has light transmissivity. The photoelectric conversion layer 10 has a transmittance of equal to or more than 90% for the light having wavelengths of 700 nm to 1000 nm which are wavelengths of the main absorption band of Si.

It is preferred that the thickness of the photoelectric conversion layer 10 is equal to or more than 500 nm and equal to or less than 10 μm. As long as the requirement for the band gap and the requirement for the p-type dopant concentration are satisfied, an additive may be contained in the photoelectric conversion layer 10.

It is preferred that equal to or more than 95% of the photoelectric conversion layer 10 is composed of cuprous oxide. That is, it is preferred that the photoelectric conversion layer 10 contains almost (substantially) no hetero phase such as CuO or Cu. It is preferred that the photoelectric conversion layer 10 contains no hetero phase such as CuO or Cu, and is a substantially a thin film of a single phase of $Cu_2O$ to achieve high light transmissivity. The fact that the photoelectric conversion layer 10 is substantially a single phase of $Cu_2O$ can be confirmed by measurement by a photo luminescence method (PL method).

It is preferred that the photoelectric conversion layer 10 is prepared by sputtering. The atmosphere during the sputtering is preferably a mixed gas atmosphere of an inert gas such as Ar and oxygen gas. Although depending on the kind of the substrate that carries a solar cell 100 (substrate 20 in FIG. 6), the sputtering is performed using a target containing Cu and a p-type dopant by heating so that the substrate temperature is equal to or more than 100° C. and equal to or less than 600° C. For example, by adjusting the temperature and the oxygen partial pressure in the sputtering, it is possible to form a thin film of cuprous oxide that is transparent and large in particle diameter.

Second Embodiment

Figure 3:
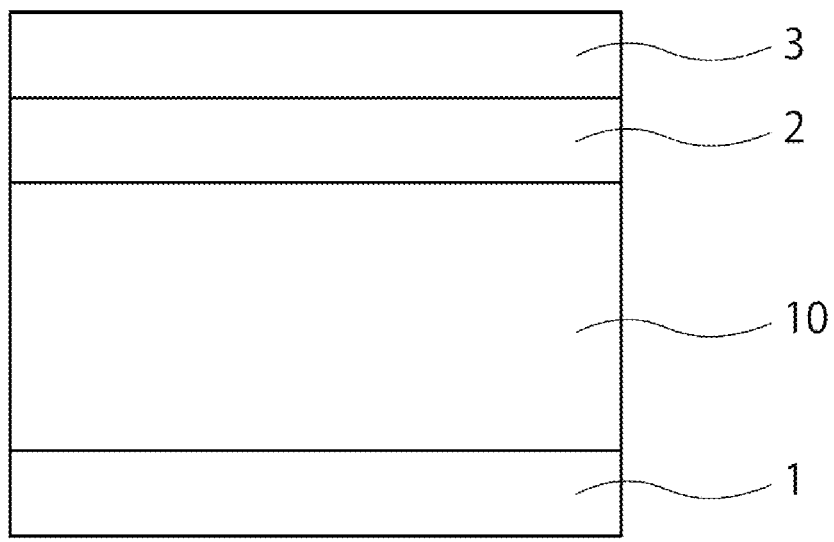
FIG. 3 is a conceptual diagram of a solar cell of an embodiment.

The second embodiment relates to a solar cell. The solar cell uses the photoelectric conversion layer 10 of the first embodiment. FIG. 3 is a conceptual diagram of the solar cell 100 of the second embodiment. As shown in FIG. 3, the solar cell 100 according to the present embodiment includes the first electrode 1, the photoelectric conversion layer 10 on the first electrode 1, the n-type layer 2 on the photoelectric conversion layer 10, and a second electrode 3 on the n-type layer 2. An interlayer (not shown) may be included between the first electrode 1 and the photoelectric conversion layer 10, or between the n-type layer 2 and the second electrode 3. The light may enter from the side of the first electrode 1, or may enter from the side of the second electrode 3. The light enters the solar cell 100, and power generation is enabled.

(First Electrode)

The first electrode 1 of the embodiment is a transparent conductive layer provided on the side of the photoelectric conversion layer 10. In FIG. 3, the first electrode 1 is in direct contact with the photoelectric conversion layer 10. As the first electrode 1, a transparent conductive film, and a laminate of a transparent conductive film and a metal film are preferred. Examples of the transparent conductive film include, but are not limited to, indium tin oxide (ITO), aluminum-doped zinc oxide (AZO), boron-doped zinc oxide (BZO), gallium-doped zinc oxide (GZO), fluorine-doped tin oxide (FTO), antimony-doped tin oxide (ATO), titanium-doped indium oxide (ITiO), indium zinc oxide (IZO), indium gallium zinc oxide (IGZO), tantalum-doped tin oxide ($SnO_2$:Ta), niobium-doped tin oxide ($SnO_2$:Nb), tungsten-doped tin oxide ($SnO_2$:W), molybdenum-doped tin oxide ($SnO_2$:Mo), fluorine-doped tin oxide ($SnO_2$:F), and hydrogen-doped indium oxide (IOH). The transparent conductive film may be a laminate film having a plurality of films, and the laminate film may contain a film of tin oxide or the like besides the aforementioned oxides. Examples of the dopant to a film of tin oxide or the like include, but are not limited to, In, Si, Ge, Ti, Cu, Sb, Nb, F, Ta, W, Mo, F, and Cl. Examples of the metal film include, but are not limited to, films of Mo, Au, Cu, Ag, Al, Ta or W. The first electrode 1 may be an electrode in which dot-like, line-like, or mesh-like metal is provided under a transparent conductive film. At this time, the dot-like, line-like or mesh-like metal is disposed on the side opposite to the photoelectric conversion layer 10 of the transparent conductive film. It is preferred that the dot-like, line-like or mesh-like metal has a porosity of equal to or more than 50% with respect to the transparent conductive film. Examples of the dot-like, line-like or mesh-like metal include, but are not limited to, Mo, Au, Cu, Ag, Al, Ta and W. When a metal film is used as the first electrode 1, it is preferred that the film thickness is about equal to or less than 5 nm from the viewpoint of the transmissivity.

(Photoelectric Conversion Layer)

The photoelectric conversion layer 10 of the embodiment is the photoelectric conversion layer of the first embodiment.

A cuprous oxide thin film can be formed on the first electrode 1. Examples of the substrate used for preparing the solar cell 100 (substrate carrying the first electrode 1) include organic substrates of acryl, polyimide, polycarbonate, polyethylene terephthalate (PET), polypropylene (PP), fluorine-based resin (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxyalkan (PFA) and so on), polyarylate, polysulfone, polyether sulfone, and polyetherimide, and inorganic substrates of soda lime glass, white sheet glass, chemically strengthened glass, quarts and the like.

(n-Type Layer)

The n-type layer 2 is a semiconductor layer disposed between the photoelectric conversion layer 10 and the second electrode 3. It is preferred that the plane of the n-type layer 2 that faces the photoelectric conversion layer 10 is in direct contact with the plane of the photoelectric conversion layer 10 that faces the n-type layer 2. The n-type layer 2 is also called an n-type layer or a buffer layer. It is preferred that the n-type layer 2 is an n-type semiconductor layer of an oxide or a sulfide. It is preferred that the n-type layer 2 is an amorphous thin film. The oxide used in the n-type layer 2 is preferably, but is not limited to, an oxide selected from the group consisting of $Zn_xA_yM_zO_w$ (A represents at least one element selected from the group consisting of Si, Ge, and Sn, M represents at least one element selected from the group consisting of B, Al, Ga, In, and Ge, $0.90 \leq x+y \leq 1.00$, $0.00 \leq z \leq 0.30$, $0.90 \leq w \leq 1.10$), $Cu_{(2-x)}M_xO$ (M=Mn, Mg, Ca, Zn, Sr, Ba, Al, Ga, In, Nb, lanthanoid), $Cu_2O:F$, $Cu_2O:N$, $Cu_2O:B$, $Cu_2O:Cl$, $Cu_2O:Br$, and $Cu_2O:I$, $Al_{(2-x)}Ga_xO_3$. The sulfide used in the n-type layer 2 is preferably, but is not limited to, at least one sulfide selected from the group consisting of $Zn_xIn_{(2-2x)}S_{(3-2x)}$, ZnS, and $In_xGa_{(1-x)}S$. The range of x is $0 \leq x \leq 1$, and the range of y is $0 \leq y \leq 2$.

When the n-type layer 2 contains Si or Ge, and Si or Ge is diffused in the photoelectric conversion layer 10 from the n-type layer 2, high concentration of Si or Ge can be contained in a region on the side of the n-type layer 2 in the photoelectric conversion layer 10 (region on the side of the n-type layer 2 in the photoelectric conversion layer 10). There is a case that the average concentration of Si and/or Ge in the region on the side of the n-type layer 2 (mean value of p-type dopant concentrations in the n-type layer side region) in the photoelectric conversion layer 10 is equal to or more than 1 time and equal to or less than 100 times the average concentration (atoms/cm$^3$) of the p-type dopant in the photoelectric conversion layer 10. The region on the side of the n-type layer 2 in the photoelectric conversion layer 10 is a region of up to a depth of 10 nm toward the side of the first electrode 1 from the interface between the photoelectric conversion layer 10 and the n-type layer 2. For the same reason as described above, it is preferred that the p-type dopant concentration in the region on the side of the n-type layer 2 in the photoelectric conversion layer 10 is equal to or more than $1 \times 10^{15}$ atoms/cm$^3$ and equal to or less than $1 \times 10^{20}$ atoms/cm$^3$ in consideration of the band gap, the hole concentration and the like. The boundary (interface) between the n-type layer 2 and the photoelectric conversion layer 10 is, for example, the position where the concentration of a main element contained in the n-type layer 2 except for Cu, O, and the p-type dopant contained in the photoelectric conversion layer 10 exceeds the Cu concentration in measurement by SIMS from the side of the n-type layer 2. The boundary (interface) between the n-type layer 2 and the photoelectric conversion layer 10 can also be determined from the interface of the layers and the composition analyzed by using scanning electron microscope-energy dispersed x-ray spectrometry (SEM-EDX).

The film thickness of the n-type layer 2 is typically equal to or more than 3 nm and equal to or less than 100 nm. If the thickness of the n-type layer 2 is equal to or less than 5 nm, a leak current can be generated in the case of poor coverage of the n-type layer 2 to deteriorate the characteristics. In the case of excellent coverage, the film thickness is not limited to the aforementioned range. If the thickness of the n-type layer 2 exceeds 100 nm, deterioration in characteristics due to excessively heightened resistance of the n-type layer 2, and decrease in a short-circuit current due to decrease in transmittance can occur. Therefore, the thickness of the n-type layer 2 is more preferably equal to or more than 5 nm and equal to or less than 50 nm, and further preferably equal to or more than 5 nm and equal to or less than 10 nm. For realizing a film having excellent coverage, the n-type layer 2 has a surface roughness of equal to or less than 5 nm. When the quality of the n-type layer 2 is high, it is possible to configure the solar cell 100 capable of operating even with a film thickness of about 200 nm.

The n-type layer 2 can be formed by atomic layer deposition (ALD), sputtering or the like.

It is preferred that a conduction band offset ($\Delta E = E_{cp} - E_{cn}$), which is a difference between the position of the conduction band minimum (CBM) ($E_{cp}$ (eV)) of the photoelectric conversion layer 10 and the position of the conduction band minimum ($E_{cn}$ (eV)) of the n-type layer 2, is equal to or more than $-0.6$ eV and equal to or less than 0.2 eV ($-0.6$ eV $\leq \Delta E \leq +0.2$ eV). If the conduction band offset is larger than 0, the conduction band of the pn junction interface is discontinuous, so that a spike arises. If the conduction band offset is smaller than 0, the conduction band of the pn junction interface is discontinuous, so that a cliff arises. Since the spike is an energy barrier in deriving photo-generated electrons from the second electrode, and the cliff decreases the voltage of the driven photo-generated electrons, smaller absolute values are preferred for the spike and the cliff. Therefore, it is more preferred that the conduction band offset is equal to or more than $-0.4$ eV and equal to or less than 0.0 eV ($-0.4$ eV $\leq \Delta E \leq 0.0$ eV). However, this does not apply to the case where conduction is achieved by utilizing the intragap level. The position of the CBM can be estimated by using the following techniques. A valence band maximum (VBM) is measured by photoelectron spectroscopy, which is a method for evaluating the electron occupation level, and a CBM is calculated while assuming a band gap of the material to be measured. However, since an actual pn junction interface fails to maintain an ideal interface such as interdiffusion or generation of holes of cations, there is a high possibility that the band gap changes. Therefore, it is preferred that CBM is evaluated by inverse photoelectron spectroscopy that directly utilizes the inverse process of photoelectric emission. Specifically, by measuring the solar cell surface by repeating the low energy ion etching, the photoelectron spectroscopy and the inverse photoelectron spectroscopy, the electron state of the pn junction interface can be evaluated.

(Second Electrode)

The second electrode 3 of the embodiment is a transparent conductive layer provided on the n-type layer 2. As the second electrode 3, it is preferred to use a transparent electrode as same as the electrode recited for the first electrode 1. The second electrode 3 may be an electrode in which dot-like, line-like, or mesh-like metal is provided on a transparent conductive film. It is preferred that the dot-like, line-like or mesh-like metal has a porosity of equal to or more than 50% with respect to the transparent conductive film. Examples of the dot-like, line-like or mesh-like metal include, but are not limited to, Mo, Au, Cu, Ag, Al, Ta and W. When a metal film is used as the second electrode 3, it is preferred that the film thickness is about equal to or less than 5 nm from the viewpoint of the transmissivity. As the second electrode 3, it is preferred to use a transparent electrode as same as the electrode recited for the first electrode 1. As the second electrode 3, other transparent electrode such as multilayer graphene provided with an extraction electrode containing metal wire can also be employed.

(Antireflection Film)

An antireflection film of the embodiment is a film for facilitating introduction of light into the photoelectric conversion layer 10, and is preferably formed on the side opposite to the photoelectric conversion layer 10 on the first electrode 1 or on the second electrode 3. As the antireflection film, it is desired to use, for example, $MgF_2$ or $SiO_2$. In the embodiment, the antireflection film may be omitted. While it is necessary to adjust the film thickness in accordance with the refractive index of each layer, it is preferred to vapor deposit a thin film having a thickness of about 70 to 130 nm (preferably, 80 to 120 nm).

Third Embodiment

Figure 4:
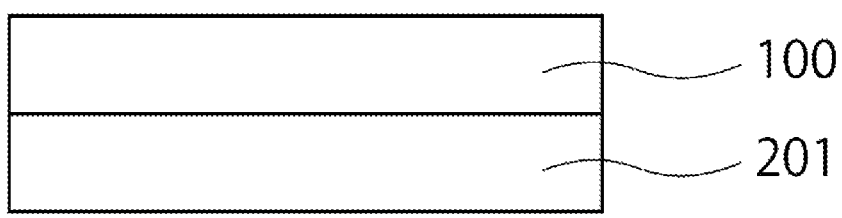
FIG. 4 is a sectional conceptual diagram of a multi-junction solar cell of an embodiment.

The third embodiment relates to a multi-junction solar cell. FIG. 4 is a sectional conceptual diagram of a multi-junction solar cell 200 of the third embodiment. The multi-junction solar cell 200 in FIG. 4 has a solar cell (first solar cell) 100 of the second embodiment on the light incident side, and a second solar cell 201. The photoelectric conversion layer of the second solar cell 201 has a band gap smaller than the band gap of the photoelectric conversion layer 10 of the solar cell 100 of the second embodiment. The multi-junction solar cell of the embodiment includes a solar cell in which three or more solar cells are junctioned.

Since the photoelectric conversion layer 10 of the solar cell 100 according to the second embodiment has a band gap of equal to or more than 2.10 eV, it is preferred that the photoelectric conversion layer of the second solar cell 201 has a band gap of equal to or more than 1.0 eV and equal to or less than 1.4 eV. It is preferred that the photoelectric conversion layer of the second solar cell 201 is a layer of at least one of a CIGS-based compound semiconductor containing In at high content, a CIT-based compound semiconductor, and a CdTe-based compound semiconductor, a copper oxide-based compound semiconductor, or crystalline silicon.

By employing the solar cell 100 according to the second embodiment as the first solar cell, the first solar cell transmits most of the light of the wavelengths of the absorption band of the photoelectric conversion layer of the bottom cell, so that it is possible to prevent the conversion efficiency of the bottom cell (second solar cell) from deteriorating, and it is possible to realize a multi-junction solar cell having excellent efficiency.

Fourth Embodiment

Figure 5:
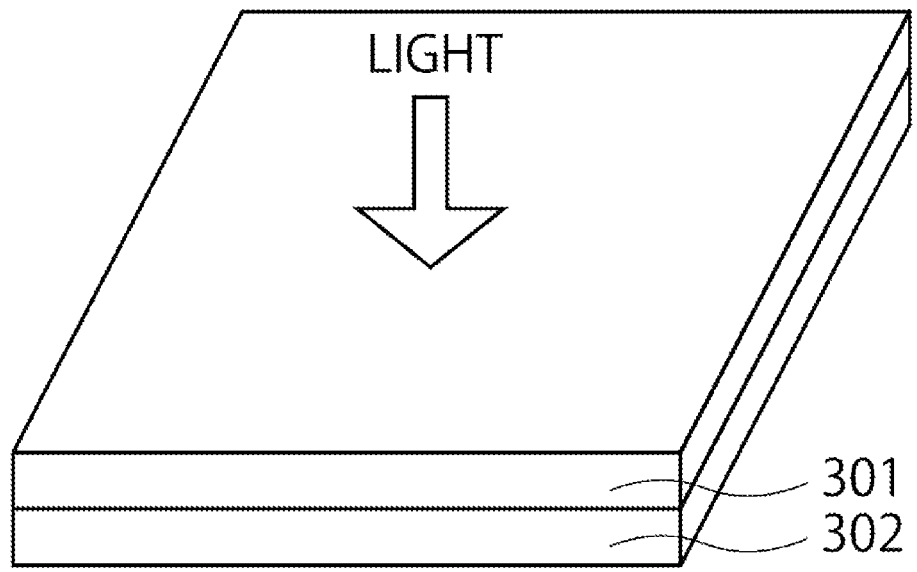
FIG. 5 is a conceptual diagram of a solar cell module of an embodiment.

The fourth embodiment relates to a solar cell module. FIG. 5 is a perspective conceptual diagram of a solar cell module 300 of the fourth embodiment. The solar cell module 300 in FIG. 5 is a solar cell module prepared by laminating a first solar cell module 301 and a second solar cell module 302. The first solar cell module 301 is on a light incident side, and uses the solar cell 100 of the second embodiment. It is preferred that the second solar cell 201 is used for the second solar cell module 302.

Figure 6:
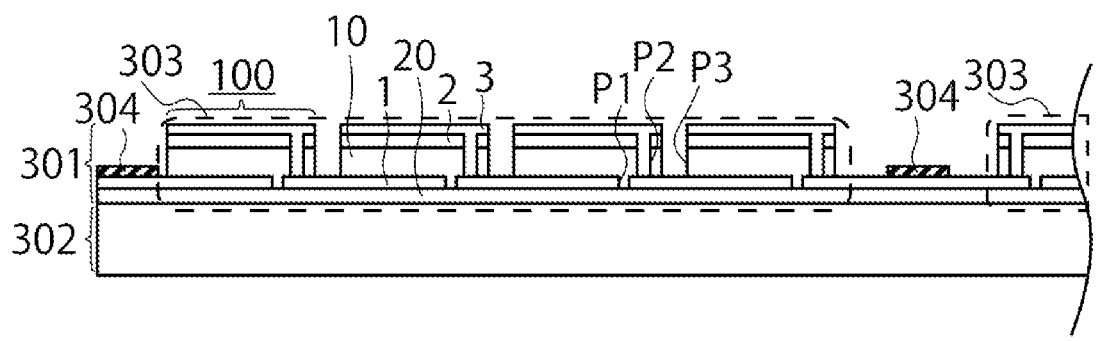
FIG. 6 is a sectional conceptual diagram of a solar cell module of an embodiment.

FIG. 6 is a sectional conceptual diagram of the solar cell module 300. FIG. 6 shows the details of the structure of the first solar cell module 301, but does not show a structure of the second solar cell module 302. In the second solar cell module 302, the structure of the solar cell module is appropriately selected depending on, for example, the photoelectric conversion layer of the solar cell to be used. The solar cell module in FIG. 6 includes a plurality of sub modules 303 surrounded by the broken line, each sub module 303 containing a plurality of solar cells 100 (solar cell element) that are arranged laterally and electrically connected in series, and the sub modules 303 are electrically connected in parallel or in series.

The solar cell 100 is scribed (P1 to P3), and in adjacent solar cells 100, the second electrode 3 on the upper side and the first electrode 1 on the lower side are connected with each other. The solar cell 100 of the third embodiment also has the first electrode 1, the photoelectric conversion layer 10, the n-type layer 2, and the second electrode 3 as with the solar cell 100 of the second embodiment, and further has a substrate 20.

Variation in output voltage between different modules leads to decrease in output of the modules because the current can counterflow to the part where the voltage is low, or excess heat can be generated.

Further, since a solar cell suited for each wavelength band can be used by using the solar cell of the present disclosure, it becomes possible to generate power at higher efficiency as compared with the case where the solar cells of the top cell and the bottom cell are used alone. This is desired because the output of the entire module increases.

If the conversion efficiency of the entire module is high, it is possible to reduce the rate of the energy to become heat among the applied light energy. Therefore, it is possible to suppress the decrease in efficiency by elevation of temperature of the entire module.

Fifth Embodiment

Figure 7:
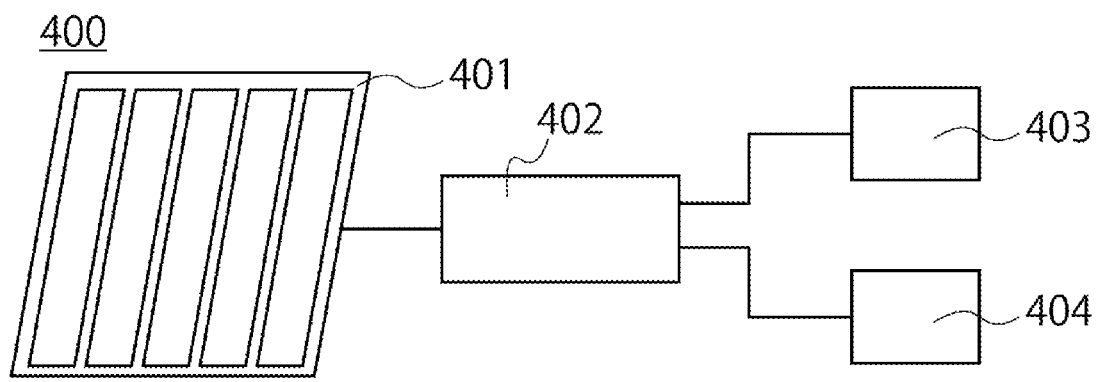
FIG. 7 is a conceptual diagram of a photovoltaic power system of an embodiment.

The fifth embodiment relates to a photovoltaic power system. The solar cell module 300 of the fourth embodiment can be used as a generator that generates power in the photovoltaic power system of the fifth embodiment. The photovoltaic power system of the embodiment generates power by using a solar cell module, and specifically has a solar cell module that generates power, a means that converts the generated power to electricity, and a storage means that stores the generated electricity or a load that consumes the generated electricity. FIG. 7 is a conceptual diagram of configuration of a photovoltaic power system 400 of an embodiment. The photovoltaic power system in FIG. 7 has a solar cell module 401 (300), a power converter 402, a storage battery 403, and a load 404. Either one of the storage battery 403 and the load 404 may be omitted. The load 404 may be configured to be capable of utilizing the electric energy stored in the storage battery 403. The power converter 402 is an apparatus including a circuit or an element that conducts voltage transformation, and power conversion such as DC/AC conversion. As the configuration of the power converter 402, a preferred configuration may be employed depending on the power generation voltage, the configuration of the storage battery 403 or the load 404.

The solar cell contained in the sub module 301 having received light, included in the solar cell module 300 generates power, and the electric energy is converted by the converter 402, and then stored in the storage battery 403 or consumed in the load 404. It is preferred that the solar cell module 401 is provided with a solar light tracking driver for continually directing the solar cell module 401 to the sun, or provided with a condenser for gathering sunlight, or an apparatus for improving the power generation efficiency is added to the solar cell module 401.

It is preferred that the photovoltaic power system 400 is used in immovable property such as a house, a commercial institution, or a factory, or in movable property such as a vehicle, an aircraft, or an electronic device. By using the solar cell of the embodiment having excellent conversion efficiency in the solar cell module 401, increase in power generation is expected.

Figure 8:
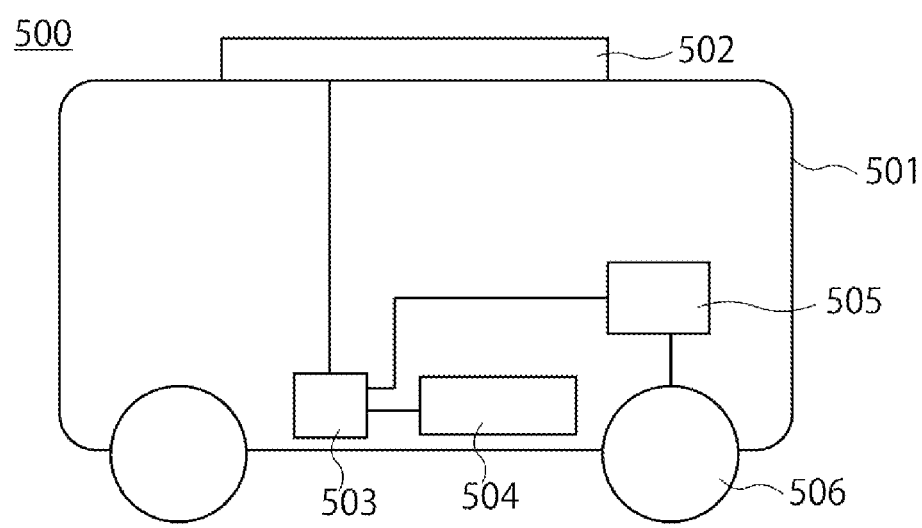
FIG. 8 is a conceptual diagram of a vehicle of an embodiment.

A vehicle is shown as an application example of the photovoltaic power system 400. FIG. 8 is a conceptual diagram of configuration of a vehicle 500. The vehicle 500 in FIG. 8 has a vehicle body 501, a solar cell module 502, a power converter 503, a storage battery 504, a motor 505 and a tire (wheel) 506. The electric power generated in the solar cell module 502 provided on the top of the vehicle body 501 is converted in the power converter 503 to charge the storage battery 504, or the electric power is consumed by a load of the motor 505 or the like. By rotating the tire (wheel) 506 by the motor 505 using the electric power supplied from the solar cell module 502 or the storage battery 504, it is possible to move the vehicle 500. The solar cell module 502 may be configured only by a first solar cell module equipped with the solar cell 100 of the second embodiment rather than the multi-junction type. When the solar cell module 502 having transmissivity is employed, it is preferred to use the solar cell module 502 on the lateral face of the vehicle body 501 as a power generating window, in addition to the top of the vehicle body 501.

Hereinafter, the present disclosure will be described more specifically based on examples, however, the present disclosure is not limited to the following examples.

Example 1

In Example 1, a white plate glass substrate is used as a substrate, and a transparent conductive film containing Sb-doped $SnO_2$ is used as the first electrode of the back side. On the first electrode, a cuprous oxide compound doped with Ge is deposited as a photoelectric conversion layer by heating the substrate at 450° C. by sputtering using Ge and Cu as targets in a mixed gas atmosphere of oxygen and argon gas. Then, Zn—Ge—O is formed as an n-type layer on the photoelectric conversion layer by an atomic layer deposition method. Thereafter, an AZO transparent conductive film is deposited as a second electrode of the front side. On the second electrode, $MgF_2$ is deposited as an antireflection film to obtain a solar cell.

Using a solar simulator simulating a light source of AM1.5G, the quantity of light is adjusted so that 1 sun is obtained using a reference Si cell under the light source. The atmospheric temperature is 25° C. The voltage is swept, and the current density (obtained by dividing current by cell area) is measured. When the voltage is plotted on the horizontal axis and the current density is plotted on the vertical axis, the intersection with the horizontal axis is open-circuit voltage Voc, and the intersection with the vertical axis is short-circuit current density Jsc. On the measurement curve, letting the points where the product of the voltage and the current density is maximum be Vmpp, Jmpp (maximum power point), respectively, FF=(Vmpp*Jmpp)/(Voc*Jsc), and the efficiency is determined by Eff.=Voc*Jsc*FF. Also, the transmittance of the solar cell is measured, and the band gap of the photoelectric conversion layer is determined by a photoluminescence method. Also, the section of the obtained solar cell is observed by SIMS, and concentration of each element is determined.

Example 2

A photoelectric conversion layer is formed in the same manner as in Example 1 except that Ta is used in place of Ge in formation of the photoelectric conversion layer, and further, a solar cell is obtained in the same manner as in Example 1. Then, various measurements are conducted in the same manner as in Example 1.

Example 3

A photoelectric conversion layer is formed in the same manner as in Example 1 except that In is used in place of Ge in formation of the photoelectric conversion layer, and further, a solar cell is obtained in the same manner as in Example 1. Then, various measurements are conducted in the same manner as in Example 1.

Example 4

A photoelectric conversion layer is formed in the same manner as in Example 1 except that Ta and In are further used in addition to Ge in formation of the photoelectric conversion layer, and further, a solar cell is obtained in the same manner as in Example 1. Then, various measurements are conducted in the same manner as in Example 1.

Example 5

A photoelectric conversion layer is formed in the same manner as in Example 1 except that Ta is further used in addition to Ge in formation of the photoelectric conversion layer, and further, a solar cell is obtained in the same manner as in Example 1. Then, various measurements are conducted in the same manner as in Example 1.

Example 6

A photoelectric conversion layer is formed in the same manner as in Example 1 except that Ta and In are used in place of Ge in formation of the photoelectric conversion layer, and further, a solar cell is obtained in the same manner as in Example 1. Then, various measurements are conducted in the same manner as in Example 1.

Example 7

A photoelectric conversion layer is formed in the same manner as in Example 1 except that the sputtering amount of Ge is increased in formation of the photoelectric conversion layer, and further, a solar cell is obtained in the same manner as in Example 1. Then, various measurements are conducted in the same manner as in Example 1.

Example 8

A photoelectric conversion layer is formed in the same manner as in Example 1 except that the sputtering amount of Ge is much increased than in Example 7 in formation of the photoelectric conversion layer, and further, a solar cell is obtained in the same manner as in Example 1. Then, various measurements are conducted in the same manner as in Example 1.

Example 9

A photoelectric conversion layer is formed in the same manner as in Example 1 except that the sputtering amount of Ge is decreased in formation of the photoelectric conversion layer, and further, a solar cell is obtained in the same manner as in Example 1. Then, various measurements are conducted in the same manner as in Example 1.

Example 10

A photoelectric conversion layer is formed in the same manner as in Example 1 except that the sputtering amount of Ge is much decreased than in Example 9 in formation of the photoelectric conversion layer, and further, a solar cell is obtained in the same manner as in Example 1. Then, various measurements are conducted in the same manner as in Example 1.

Example 11

A photoelectric conversion layer is formed in the same manner as in Example 1 except that the variation in Ge amount to be doped is decreased in formation of the photoelectric conversion layer, and further, a solar cell is obtained in the same manner as in Example 1. Then, various measurements are conducted in the same manner as in Example 1.

Example 12

A photoelectric conversion layer is formed in the same manner as in Example 1 except that the variation in Ge amount to be doped is much decreased than in Example 11 in formation of the photoelectric conversion layer, and further, a solar cell is obtained in the same manner as in Example 1. Then, various measurements are conducted in the same manner as in Example 1.

Example 13

A photoelectric conversion layer is formed in the same manner as in Example 1 except that the variation in Ge amount to be doped is increased in formation of the photoelectric conversion layer, and further, a solar cell is obtained in the same manner as in Example 1. Then, various measurements are conducted in the same manner as in Example 1.

Example 14

A photoelectric conversion layer is formed in the same manner as in Example 1 except that the variation in Ge amount to be doped is increased in formation of the photoelectric conversion layer, and further, a solar cell is obtained in the same manner as in Example 1. Then, various measurements are conducted in the same manner as in Example 1.

Example 15

A photoelectric conversion layer is formed in the same manner as in Example 1. Then, a solar cell is obtained in the same manner as in Example 1 except that Zn—Si—O is deposited as an n-type layer, and Si is diffused in the photoelectric conversion layer. Then, various measurements are conducted in the same manner as in Example 1, and p-type dopant concentrations from the surface on the n-type layer side of the photoelectric conversion layer to the depth of 10 nm are measured.

Example 16

A photoelectric conversion layer is formed in the same manner as in Example 1. Then, a solar cell is obtained in the same manner as in Example 1 except that an n-type layer is formed, and Ge is diffused in the photoelectric conversion layer from the n-type layer. Then, various measurements are conducted in the same manner as in Example 1, and p-type dopant concentrations from the surface on the n-type layer side of the photoelectric conversion layer to the depth of 10 nm are measured.

Example 17

A photoelectric conversion layer is formed in the same manner as in Example 1 except that the Ge amount to be doped is decreased in formation of the photoelectric conversion layer, and further, a solar cell is obtained in the same manner as in Example 1. Then, various measurements are conducted in the same manner as in Example 1.

Example 18

A photoelectric conversion layer is formed in the same manner as in Example 2 except that the Ta amount to be doped is decreased in formation of the photoelectric conversion layer, and further, a solar cell is obtained in the same manner as in Example 1. Then, various measurements are conducted in the same manner as in Example 1.

Example 19

A photoelectric conversion layer is formed in the same manner as in Example 3 except that the In amount to be doped is decreased in formation of the photoelectric conversion layer, and further, a solar cell is obtained in the same manner as in Example 1. Then, various measurements are conducted in the same manner as in Example 1.

Example 20

A photoelectric conversion layer is formed in the same manner as in Example 1 except that the Ge amount to be doped in the center part in the thickness direction of the photoelectric conversion layer is decreased in formation of the photoelectric conversion layer, and further, a solar cell is obtained in the same manner as in Example 1. Then, various measurements are conducted in the same manner as in Example 1.

Example 21

A photoelectric conversion layer is formed in the same manner as in Example 1 except that the Ge amount to be doped on the first electrode side is decreased in formation of the photoelectric conversion layer, and further, a solar cell is obtained in the same manner as in Example 1. Then, various measurements are conducted in the same manner as in Example 1.

Example 22

A photoelectric conversion layer is formed in the same manner as in Example 1 except that the deposition rate is decreased in formation of the photoelectric conversion layer, and further, a solar cell is obtained in the same manner as in Example 1. Then, various measurements are conducted in the same manner as in Example 1.

Comparative Example 1

A photoelectric conversion layer is formed in the same manner as in Example 1 except that none of Ge, Ta, and In is used in formation of the photoelectric conversion layer, and further, a solar cell is obtained in the same manner as in Example 1. Then, various measurements are conducted in the same manner as in Example 1.

Comparative Example 2

A photoelectric conversion layer is formed in the same manner as in Example 1 except that the Ge amount to be doped is greatly increased in formation of the photoelectric conversion layer, and further, a solar cell is obtained in the same manner as in Example 1. Then, various measurements are conducted in the same manner as in Example 1.

Comparative Example 3

A photoelectric conversion layer is formed in the same manner as in Example 2 except that the Ta amount to be doped is greatly increased in formation of the photoelectric conversion layer, and further, a solar cell is obtained in the same manner as in Example 1. Then, various measurements are conducted in the same manner as in Example 1.

Comparative Example 4

A photoelectric conversion layer is formed in the same manner as in Example 3 except that the In amount to be doped is decreased in formation of the photoelectric conversion layer, and further, a solar cell is obtained in the same manner as in Example 1. Then, various measurements are conducted in the same manner as in Example 1.

Table 1 shows the results of Examples and Comparative Examples. For each of FF, Jsc, conversion efficiency, and transmittance, when the characteristic is improved compared with Comparative Example 1, the evaluation is A (A⁻ when the characteristic is slightly improved), whereas when each of FF, Jsc, conversion efficiency, and transmittance is less than that of Comparative Example 1, the evaluation is B. The entire mean value in the Table is a mean value of entire p-type dopant concentration. The n-type layer side mean value in the Table is a mean value of front-side p-type dopant concentration. The central mean value in the Table is a mean value of central p-type dopant concentration. The first electrode side mean value in the Table is a mean value of back-side p-type dopant concentration. The n-type layer side region mean value in the Table is a mean value of p-type dopant concentrations in the n-type layer side region.

TABLE 1A

|  | Jsc | FF | Conversion efficiency | Transmittance | Band gap [eV] |
|---|---|---|---|---|---|
| Example 1 | A | A | A | A | 2.10 |
| Example 2 | A | A | A | A | 2.10 |
| Example 3 | A | A | A | A | 2.10 |
| Example 4 | A | A | A | A | 2.10 |
| Example 5 | A | A | A | A | 2.10 |
| Example 6 | A | A | A | A | 2.10 |
| Example 7 | A | A | A | A | 2.10 |
| Example 8 | A | A | A | A | 2.10 |
| Example 9 | A | A | A | A | 2.10 |
| Example 10 | A | A | A | A | 2.10 |
| Example 11 | A | A | A | A | 2.10 |
| Example 12 | A | A | A | A | 2.10 |
| Example 13 | A | A | A | A | 2.10 |
| Example 14 | A | A | A | A | 2.10 |
| Example 15 | A | A | A | A | 2.10 |
| Example 16 | A | A | A | A | 2.10 |
| Example 17 | A⁻ | A⁻ | A⁻ | A | 2.10 |
| Example 18 | A⁻ | A⁻ | A⁻ | A | 2.10 |
| Example 19 | A⁻ | A⁻ | A⁻ | A | 2.10 |
| Example 20 | A⁻ | A⁻ | A⁻ | A | 2.10 |
| Example 21 | A⁻ | A⁻ | A⁻ | A | 2.10 |
| Example 22 | A | A | A | A | 2.30 |
| Comparative Example 1 | — | — | — | — | 2.10 |
| Comparative Example 2 | B | B | B | B | 1.95 |
| Comparative Example 3 | B | B | B | B | 1.95 |
| Comparative Example 4 | B | B | B | B | 1.90 |

TABLE 1B

|  | p-type dopant concentration [atoms/cm³] | | | | | | |
|---|---|---|---|---|---|---|---|
|  | Lowest value | Highest value | Entire mean value | n-type layer side mean value | Central mean value | First electrode side mean value | n-type layer side region mean value |
| Example 1 | 2.0E+16 | 4.7E+19 | 2.4E+18 | 4.1E+17 | 2.8E+16 | 6.8E+18 | — |
| Example 2 | 3.1E+16 | 1.6E+19 | 1.9E+18 | 4.5E+17 | 3.5E+16 | 5.3E+18 | — |
| Example 3 | 2.9E+16 | 8.4E+18 | 1.4E+18 | 3.0E+17 | 3.3E+16 | 4.0E+18 | — |
| Example 4 | 1.4E+16 | 2.1E+19 | 2.4E+18 | 1.2E+17 | 2.1E+17 | 7.0E+18 | — |
| Example 5 | 1.3E+16 | 9.0E+18 | 1.1E+18 | 9.2E+16 | 1.7E+16 | 3.1E+18 | — |
| Example 6 | 5.3E+16 | 1.3E+19 | 2.2E+18 | 3.5E+17 | 5.5E+16 | 6.3E+18 | — |
| Example 7 | 8.5E+16 | 2.4E+19 | 3.0E+18 | 9.8E+17 | 9.0E+16 | 8.0E+18 | — |
| Example 8 | 1.0E+17 | 5.1E+19 | 6.0E+18 | 1.9E+18 | 1.4E+17 | 1.6E+19 | — |
| Example 9 | 6.4E+15 | 3.5E+18 | 8.1E+17 | 1.1E+17 | 7.0E+15 | 2.3E+18 | — |

TABLE 1B-continued

| | p-type dopant concentration [atoms/cm$^3$] | | | | | | |
|---|---|---|---|---|---|---|---|
| | Lowest value | Highest value | Entire mean value | n-type layer side mean value | Central mean value | First electrode side mean value | n-type layer side region mean value |
| Example 10 | 1.6E+15 | 7.6E+18 | 4.6E+17 | 9.0E+16 | 2.0E+15 | 1.3E+18 | — |
| Example 11 | 1.5E+16 | 2.6E+18 | 2.0E+17 | 4.0E+16 | 1.7E+16 | 5.5E+17 | — |
| Example 12 | 1.2E+16 | 1.2E+18 | 9.6E+16 | 2.3E+16 | 1.5E+16 | 2.5E+17 | — |
| Example 13 | 4.6E+15 | 9.3E+19 | 9.8E+18 | 2.7E+17 | 4.8E+15 | 2.9E+19 | — |
| Example 14 | 1.5E+15 | 1.9E+19 | 4.6E+18 | 5.0E+18 | 1.8E+15 | 8.7E+18 | — |
| Example 15 | 3.2E+16 | 4.1E+19 | 8.4E+18 | 8.3E+18 | 3.7E+16 | 1.7E+19 | 5.2E+19 |
| Example 16 | 3.9E+16 | 2.9E+19 | 5.2E+18 | 6.2E+18 | 4.1E+16 | 9.3E+18 | 8.1E+19 |
| Example 17 | 1.1E+15 | 3.5E+16 | 5.1E+16 | 1.4E+17 | 1.3E+15 | 1.3E+16 | — |
| Example 18 | 5.0E+15 | 7.4E+15 | 2.8E+16 | 7.3E+16 | 5.3E+15 | 5.0E+15 | — |
| Example 19 | 1.4E+15 | 7.0E+15 | 3.1E+16 | 8.7E+16 | 1.7E+15 | 4.4E+15 | — |
| Example 20 | 1.2E+15 | 9.2E+17 | 3.1E+16 | 3.0E+16 | 1.4E+15 | 6.1E+16 | — |
| Example 21 | 2.1E+15 | 9.1E+15 | 4.7E+15 | 3.8E+15 | 2.3E+15 | 7.9E+15 | — |
| Example 22 | 2.8E+16 | 3.0E+19 | 2.1E+18 | 4.0E+17 | 3.0E+16 | 6.0E+18 | — |
| Comparative Example 1 | 1.0E+14 | 3.2E+14 | 2.3E+14 | 1.0E+14 | 3.2E+14 | 2.8E+14 | — |
| Comparative Example 2 | 5.8E+20 | 9.0E+20 | 7.9E+20 | 9.0E+20 | 5.8E+20 | 8.9E+20 | — |
| Comparative Example 3 | 3.9E+21 | 8.2E+21 | 5.7E+21 | 8.2E+21 | 3.9E+21 | 5.0E+21 | — |
| Comparative Example 4 | 1.1E+21 | 1.8E+21 | 1.5E+21 | 1.1E+21 | 1.7E+21 | 1.8E+21 | — |

Regarding the solar batteries of Examples, FF, and Jsc entirely improved only in the case where an element to be a p-type dopant is added to the photoelectric conversion layer 10, and thus the efficiency of solar batteries of Examples improved. It is inferable that reduction in crystal defects by addition of an element ameliorates recombination of photo-generated carriers inside the photoelectric conversion layer 10 as evidenced from that control of the hole concentration in the photoelectric conversion layer 10 is enabled by addition of a p-type dopant, and the crystallinity of the photoelectric conversion layer 10 itself is improved by addition of a p-type dopant. As shown in the foregoing Examples, by addition of an appropriate element to the mixing region 2a or the mixing layer 2b, it becomes possible to realize a high-efficiency solar cell using a photoelectric conversion layer based on cuprous oxide.

In the specification, some of the elements are indicated only by symbols of elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photoelectric conversion layer comprising Cu$_2$O, and further comprising a p-type dopant of Ta, the photoelectric conversion layer having a band gap of equal to or more than 2.10 eV and equal to or less than 2.30 eV.

2. The photoelectric conversion layer according to claim 1, wherein
a lowest value of concentration of the p-type dopant in the photoelectric conversion layer is equal to or more than $1 \times 10^{15}$ atoms/cm$^3$, and
a highest value of concentration of the p-type dopant in the photoelectric conversion layer is equal to or less than $1 \times 10^{20}$ atoms/cm$^3$.

3. The photoelectric conversion layer according to claim 1, wherein a mean value of p-type dopant concentration in the photoelectric conversion layer is equal to or more than $1 \times 10^{15}$ atoms/cm$^3$ and equal to or less than $1 \times 10^{19}$ atoms/cm$^3$.

4. The photoelectric conversion layer according to claim 1, wherein a highest value of concentration of the p-type dopant in the photoelectric conversion layer is equal to or more than 1 time and equal to or less than 10,000 times a lowest value of concentration of the p-type dopant in the photoelectric conversion layer.

5. The photoelectric conversion layer according to claim 1, wherein, in the photoelectric conversion layer, a mean value of p-type dopant concentration at a depth of 100 nm from a front side of the photoelectric conversion layer is equal to or less than 100 times a mean value of p-type dopant concentration at a depth of a half of a thickness of the photoelectric conversion layer, and a mean value of p-type dopant concentration at a depth of 100 nm from a back side of the photoelectric conversion layer is equal to or less than 1000 times a mean value of p-type dopant concentration at a depth of the half of a thickness of the photoelectric conversion layer.

6. The photoelectric conversion layer according to claim 1, wherein Cu$_2$O occupies equal to or more than 90 wt % of the photoelectric conversion layer.

7. A solar cell comprising:
a transparent first electrode;
the photoelectric conversion layer according to claim 1 on the first electrode;
an n-type layer on the photoelectric conversion layer; and
a transparent second electrode on the n-type layer.

8. The solar cell according to claim 7, wherein an average concentration of Ta in a region up to a depth of 50 nm on a side of the first electrode from an interface between the photoelectric conversion layer and the n-type layer is equal to or more than 1 time and equal to or less than 100 times an average concentration of the p-type dopant in the photoelectric conversion layer.

9. A multi-junction solar cell comprising the solar cell according to claim 7.

10. A solar cell module comprising the solar cell according to claim 7.

11. A photovoltaic power system configured to generate power by using the solar cell module according to claim 10.

12. The photoelectric conversion layer according to claim 1, wherein Ge is also included as the p-type dopant which is comprised in the photoelectric conversion layer.

13. The photoelectric conversion layer according to claim 1, wherein a concentration of the p-type dopant in the photoelectric conversion layer is equal to or more than $1\times10^{15}$ atoms/cm$^3$ and equal to or less than $1\times10^{18}$ atoms/cm$^3$.

* * * * *